(12) United States Patent
Andricacos et al.

(10) Patent No.: US 6,911,229 B2
(45) Date of Patent: Jun. 28, 2005

(54) STRUCTURE COMPRISING AN INTERLAYER OF PALLADIUM AND/OR PLATINUM AND METHOD FOR FABRICATION THEREOF

(75) Inventors: Panayotis C. Andricacos, Croton-on-Hudson, NY (US); Steven H. Boettcher, Fishkill, NY (US); Fenton Read McFeely, Ossining, NY (US); Milan Paunovic, Port Washington, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/215,324

(22) Filed: Aug. 9, 2002

(65) Prior Publication Data

US 2004/0028882 A1 Feb. 12, 2004

(51) Int. Cl.⁷ .............. B05D 5/12; H01L 21/44; C23C 14/32
(52) U.S. Cl. ............. 427/97.7; 427/97.9; 438/633; 438/643; 438/653; 438/675; 438/687; 438/680; 204/192.1; 204/192.15
(58) Field of Search .................. 438/633, 643, 438/653, 675, 687, 680, 692; 204/192.1, 192.15; 427/97.9, 97.7, 97

(56) References Cited

U.S. PATENT DOCUMENTS

| | | | | |
|---|---|---|---|---|
| 6,136,693 A | * | 10/2000 | Chan et al. | 438/633 |
| 6,204,204 B1 | * | 3/2001 | Paranjpe et al. | 438/785 |
| 6,251,781 B1 | * | 6/2001 | Zhou et al. | 438/687 |
| 6,294,836 B1 | * | 9/2001 | Paranjpe et al. | 257/767 |
| 6,362,099 B1 | * | 3/2002 | Gandikota et al. | 438/687 |
| 6,495,200 B1 | * | 12/2002 | Chan et al. | 427/97 |

* cited by examiner

*Primary Examiner*—Brian K. Talbot
(74) *Attorney, Agent, or Firm*—Connolly Bove Lodge & Hutz, LLP; Robert M. Trepp

(57) ABSTRACT

An interconnection structure comprising a substrate having a dielectric layer with a via opening therein; a barrier layer located in the via opening; an interlayer of palladium and/or platinum on the barrier layer; and a layer of copper or copper alloy on the interlayer is provided.

14 Claims, 2 Drawing Sheets

STRUCTURE COMPRISING AN INTERLAYER OF PALLADIUM AND/OR PLATINUM AND METHOD FOR FABRICATION THEREOF

FIELD OF THE INVENTION

The present invention relates to interconnection wiring on electronic devices such as on integrated circuits (IC) chips and more particularly to encapsulated copper interconnection in integrated circuits.

BACKGROUND OF THE INVENTION

In the past, Al—Cu and its related alloys were the preferred alloys for forming interconnections on electronic devices such as integrated circuit chips. The amount of Cu in Al—Cu is typically in the range of 0.3 to 4 percent.

Replacement of Al—Cu by Cu and Cu alloys as chip interconnection materials results in advantages of performance. Performance is improved because the resistivity of Cu and certain copper alloys is less than the resistivity of Al—Cu; thus narrower lines can be used and higher wiring densities will be realized.

The advantages of Cu metallization have been recognized by the semiconductor industry. In fact, the semiconductor industry is rapidly moving away from aluminum and is adopting copper as the material of choice for chip interconnects because of its high conductivity and improved reliability.

Manufacturing of chip interconnects involves many process steps that are interrelated. In particular, copper interconnects are manufactured using a process called "Dual Damascene" in which a via and a line are fabricated together in a single step. An integration issue that needs to be overcome to successfully fabricate Dual Damascene copper interconnects is the adhesion of the barrier to seed layer films and to the copper interconnects. In addition, the International Technology Roadmap for Semiconductors, 1999 Edition, calls for small via diameters and higher aspect ratios in future interconnect metallizations.

In may prior art techniques, copper is electrodeposited on a copper seed layer which in turn is deposited onto a diffusion layer. Both diffusion barrier and Cu seed layer are typically deposited using physical vapor deposition (PVD), ionized physical vapor deposition (IPVD), or chemical vapor deposition (CVD) techniques (Hu et al. Mat. Chem. Phys., 52 (1998)5). Moreover, the diffusion barrier is frequently composed of two layers (e.g. Ti/TiN bilayer barrier).

Accordingly, room exists for improvement in the prior art for improving the adhesion to the seed layer or copper layers.

SUMMARY OF THE INVENTION

The present invention makes it possible to fabricate completely encapsulated copper interconnections for integrated circuits employing certain interlayers between the copper or seed layer and the underlying barrier layer. The present invention is concerned with employing an interlayer of platinum and/or palladium.

In particular, the present invention relates to an electronic structure comprising a substrate having a dielectric layer having a via opening therein; the via opening having sidewalls and bottom surfaces; and a barrier layer on the sidewalls and bottom surfaces of the via opening; an interlayer of palladium and/or platinum; a layer of copper or copper alloy located on the interlayer.

Another aspect of the present invention relates to a method for fabricating an electronic structure which comprises forming an insulating material on a substrate; lithographically defining and forming recesses for lines and/or via in the insulating material in which interconnection conductor material will be deposited; a barrier layer in the recesses; depositing an interlayer of palladium and/or platinum; and depositing copper or a copper alloy on the interlayer to fill the recesses.

Still other objects and advantages of the present invention will become readily apparent by those skilled in the art from the following detailed description, wherein it is shown and described preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

Figure 1:
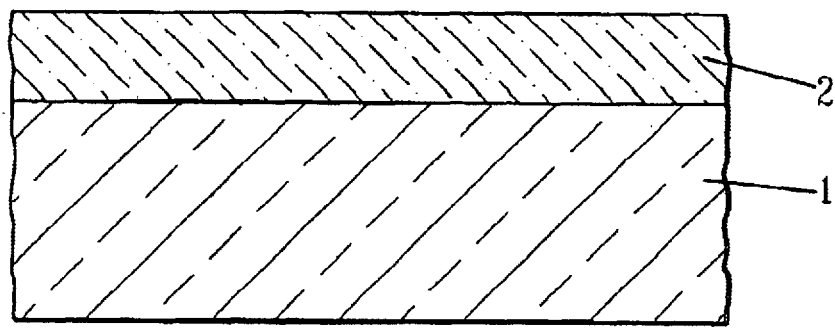
FIGS. 1–6 are schematic diagram structures according to the present invention at different stages of fabrication.

Reference will be made to the figure to facilitate an understanding of the present invention. As shown in FIG. 1, the structures according to the present invention can be obtained by providing an insulating material 2 such as silicon dioxide on a substrate 1 (e.g. a semiconductor wafer substrate).

Figure 2:
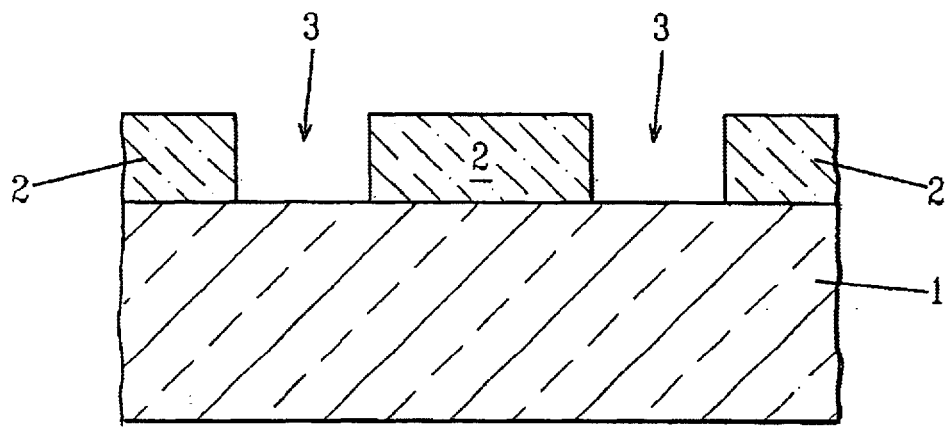
Figure 3:
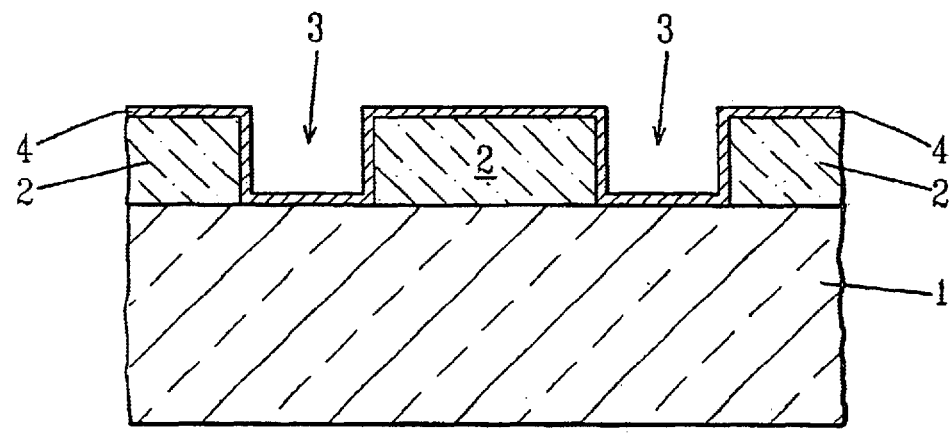

Lines and/or vias openings 3 are lithographically defined and foiled in the insulating material 2 by well-known techniques as illustrated in FIG. 2. A barrier layer 4 is deposited onto structure as illustrated in FIG. 3. The barrier layer is typically deposited by CVD (chemical vapor deposition), or sputtering such as physical vapor deposition (PVD) or ionized physical vapor deposition (IPVD).

Figure 4:
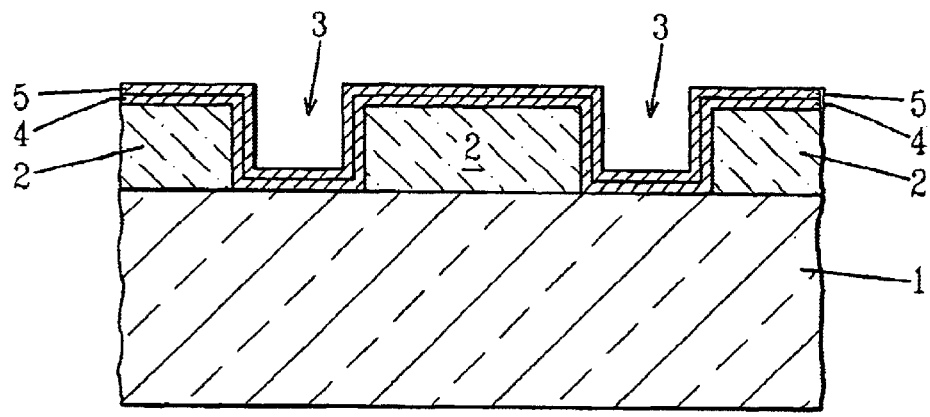

According to the present invention, an interlayer 5 of palladium and/or platinum is deposited onto the barrier layer 4 as illustrated in FIG. 4. The interlayer can be deposited by CVD, PVD or IPVD techniques. The interlayer 5 is typically about 50 Angstroms to about 500 Angstroms thick and more typically about 50 Angstroms to about 100 Angstroms thick.

Figure 5:
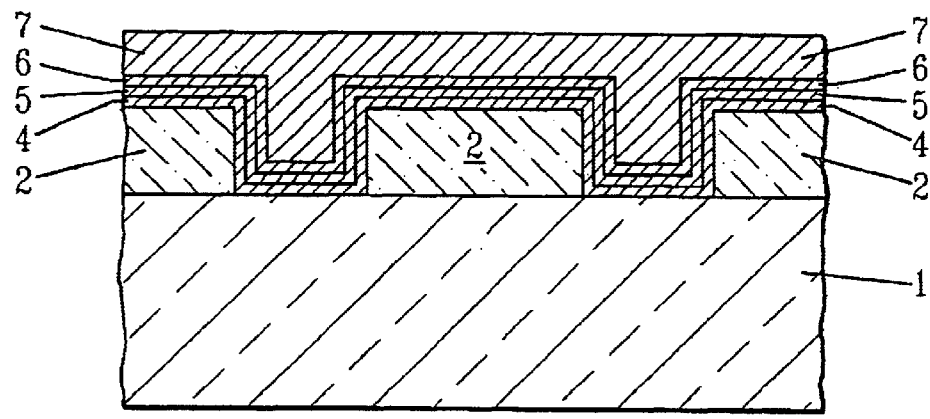

The interlayer 5 enhances adhesion between the barrier layer 4 and subsequently to be deposited copper layers. The interlayer 5 can be deposited, for instance, by sputter deposition or chemical vapor deposition (CVD). If desired, optionally, a seed layer 6 such as copper can be deposited onto the interlayer 5 as illustrated in FIG. 5. The seed layer 6 is not required according to the present invention. The copper layer 6 can be deposited such as by electrochemical deposition including electroless or electroplating techniques.

The seed layer 6 when employed is typically about 50 to about 200 nanometers thick and more typically about 60 to about 100 nanometers thick.

Typical electroless copper plating compositions are aqueous compositions comprising a source of cupric ions, a reducing agent and a complexing agent. The compositions can also include stabilizers, surfactants, levelers and brighteners.

A typical source of cupric ions is $CuSO_4$. A typical reducing agent is formaldehyde. Typical complexing agents are ethylenediamine tetraacetic acid (EDTA) and salts thereof.

Typical stabilizers are sodium cyanamide and 2,2'-dipyridil. A typical surfactant is Triton X-114 (polyoxyethylene isooctyl phenyl ether).

The composition typically has a pH of about 10.8 to about 13 which can be adjusted by adding a pH adjuster such as NaOH or KOH. The electroless deposition is typically carried out at about 20° C. to about 35° C. at a deposition rate of 25 nm/minute. In addition, the copper seed layer 6 can be electrodeposited from an aqueous acidic copper solution.

A copper or copper alloy layer 7 is then deposited onto the interlayer 5 or the copper seed layer 6 when present. The copper can be deposited directly on the interlayer 5 without any seed layer by electrochemical deposition such as electroplating or electroless plating. Examples of suitable electroplating compositions are disclosed in U.S. Ser. No. 09/348,632 disclosure of which is incorporated herein by reference. The copper plating is employed to fill the lines and/or vias openings 3.

Figure 6:
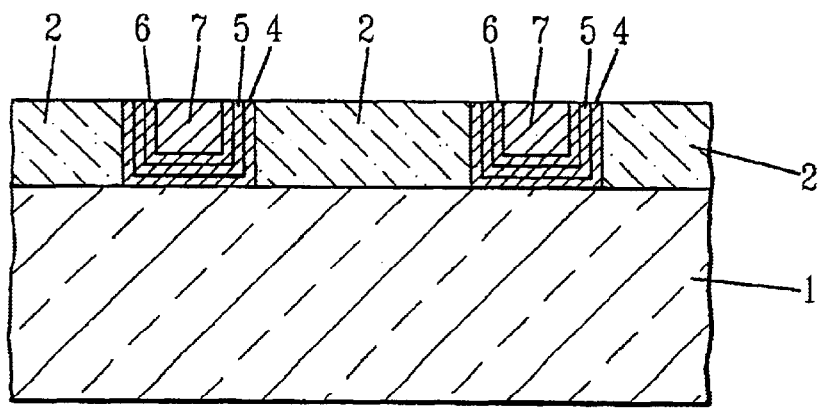

Any layers 4, 5 and 6 present on the top surface of the substrate can be removed as illustrated in FIG. 6 by, for example, chemical mechanical polishing (CMP) to provide a planarized structure with copper being flush with the substrate and to achieve electrical isolation of individual lines and/or vias.

If desired, the chemical mechanical polishing can be carried out prior to depositing the copper in the event of electroless deposition.

The technique of the present invention can be used for Single and Dual Damascene structures.

For the purposed of plating tests on blanket substrates, all depositions of platinum and palladium wee carried out by simple sputter deposition onto tungsten substrates which had previously been prepared by CVD from tungsten hexacarbonyl. Deposits of Pt and Pd wee typically on the order of 5 nm thick, and no particular sensitivity to the details of the depositions was noted in the patting experiments.

For the preferred implementation, the W/Pt and W/Pd structures can be deposited via a number of precursors on top of the W layer. The following procedure is to be employed. First the initial layer of W is deposited. This is accomplished by placing the substrate to be coated in a low pressure (base pressure less than 10(−6) torr) CVD reactor, and heating the substrate to a temperature in a range of 370–430 C. Tungsten hexacarbonyl vapor, entrained in an inert carrier gas (Ar) is flowed over the substrate until a film of the desired thickness is grown, typically 5 nm–30 nm. The flow of the W(CO)6 vapor is then halted and the chamber evacuated, and the substrate temperature adjusted as desired. Depending upon the precursor selected for the deposition of Pd or Pt, it may be possible to employ the same deposition temperature as that used for the tungsten. At this point the flow of the pT or Pd precursor, entrained as was the W(CO)6 in an inert gas or other suitable carrier (e.g. CO in some cases), is admitted into the chamber and allowed to flow over the heated substrate until a sufficient deposition has been achieved.

As the substrate would at this point be covered by a continuous layer of W, there is considerable latitude in the selection of precursors for Pt and Pd. In the case of Pt, these include the carbonyl chloride, Pt(acac)2, (acac=acetoacetonate), Pt(PF3)4, and various organometallics involving cyclooctadienly, cycloentadienly, alkyl, and allyl ligands. For the Pd, the number of suitable compounds is less extensive, however various bis(allyl) compounds, cyclopentadienely allyl Palladdium, and Pd(hfac)2 (hfac=hexafluoroacetoacetonate) are all suitable.

The following non-limiting examples are presented to further illustrate the present invention.

EXAMPLE 1

An electroless copper seed layer is deposited onto a structure of 50 nm sputtered Pd/10 nm PVD Ta/SiO$_2$/Si from LeaRonal Electroless Coppermerse 20 solution having a pH of about 13.00, a commercially available bath. The bath has a deposition rate of 25 nm/minute at 25° C. The copper deposit, 25 nm thick, was an adherent coating and suitable for the present invention.

EXAMPLE 2

Example 1 was repeated that the plating time is extended to produce a copper deposit of 50 nm thick. The deposit was an adherent coating.

EXAMPLE 3

A copper seed layer is electrodeposited onto a structure of 50 un sputtered Pd/10 nm PVD Ta/SiO$_2$/Si from Sel-Rex acid copper solution, a commercially available bath. Electrodeposition is carried out at a rate of 10 mA/cm$^2$. A copper deposit of 221 nm thickness was an adherent coating.

EXAMPLE 4

Example 3 was repeated except that the plating time is extended to produce a copper deposit of about 663 nm thickness. The deposit was an adherent coating.

EXAMPLE 5

A copper seed layer is electrodeposited onto a structure of 5 nm Pd/10 nm Ta/SiO$_2$/Si from an alkaline copper solution of the following composition:

| | |
|---|---|
| CuSO$_4$.5H$_2$O | 0.03–0.08 M |
| EDTA completing agent, ethylene diamine tetraacetic acid or a sodium mono, -di, tri, or tetra-sodium salt of EDTA) | 0.05–0.20 M |
| NaOH to pH 10.8–13. | |
| 2,2'-dipyridyl | $10^{-8}$–$10^{-2}$ M/L |
| Triton X-114 | 0.10–0.30 mL/L (Triton X-114: polyoxyethylene (8) isoctylphenyl ether) |
| H$_2$O | to 1 L |
| Temperature | 20–35° C. |

Electrodeposition is carried out at a rate of 7.8 mA/cm$^2$
A copper deposit of 87 nm thickness was an adherent deposit.

EXAMPLE 6

An electroless copper seed layer is deposited onto a structure of 1.5 nm Pd/CVD W/SiO2/Si from the solution in example 5, at 50–65° C., to which formaldehyde (CH$_2$O, 37% solution) is added as a reducing agent for Cu$^{2+}$ ions. The bath has a deposition rate of about 5 to 60 nm/minute. A copper deposit of 25 nm thickness, was an adherent coating and suitable for the present invention.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method for fabricating an electronic structure which comprises forming an insulating material on a substrate; lithographically defining and forming recesses for lines, or vias or both in the insulating material in which interconnection conductor material will be deposited;

depositing in the recesses a barrier layer, wherein the barrier layer is selected from the group consisting of tungsten, alloys of tungsten, titanium, alloys of titanium, titanium nitride, tantalum, tantalum nitride and tantalum silicon nitride;

depositing an interlayer of a member selected from the group consisting of palladium, platinum and mixtures thereof, wherein the interlayer is about 50 to about 500 Angstroms thick; and depositing copper or a copper alloy on the interlayer to fill the recesses; and wherein said interlayer is intermediate said coppoer or copper alloy and said barrier layer.

2. The method of claim 1 wherein the copper or copper alloy is deposited by electrochemical deposition.

3. The method of claim 1 which further comprises planarizing the structure.

4. The method of claim 1 wherein the interlayer is deposited by sputtering or CVD.

5. The method of claim 1 wherein said interlayer is palladium.

6. The method of claim 1 wherein said interlayer is platinum.

7. The method of claim 1 wherein the interlayer is about 50 to about 100 Angstroms thick.

8. The method of claim 1 wherein the dielectric layer comprises silicon dioxide.

9. The of claim 1 wherein the via opening is about 100 to about 500 nanometers wide.

10. The method of claim 1 wherein the barrier layer is about 5 to about 200 nanometers thick.

11. The method of claim 1 which further comprises depositing a copper seed layer on said interlayer intermediate between said copper or copper alloy and said interlayer.

12. The method of claim 11 wherein said interlayer is deposited by sputtering or CVD.

13. The method of claim 11 wherein the seed layer is deposited from an electroless bath.

14. The method of claim 11 wherein the seed layer is electrodeposited from an aqueous acidic copper bath.

* * * * *